United States Patent
Lu et al.

(10) Patent No.: US 8,999,775 B2
(45) Date of Patent: Apr. 7, 2015

(54) METHOD OF FABRICATING PIXEL STRUCTURE AND PIXEL STRUCTURE THEREOF

(71) Applicant: AU Optronics Corp., Hsin-Chu (TW)

(72) Inventors: Ssu-Hui Lu, Hsin-Chu (TW); Ming-Hsien Lee, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 86 days.

(21) Appl. No.: 13/905,107

(22) Filed: May 29, 2013

(65) Prior Publication Data

US 2014/0284606 A1     Sep. 25, 2014

(30) Foreign Application Priority Data

Mar. 25, 2013 (TW) .............................. 102110487 A

(51) Int. Cl.
*H01L 21/84* (2006.01)
*H01L 21/30* (2006.01)
*H01L 27/12* (2006.01)

(52) U.S. Cl.
CPC ........ *H01L 21/3003* (2013.01); *H01L 27/1248* (2013.01); *H01L 27/127* (2013.01)

(58) Field of Classification Search
None
See application file for complete search history.

(56) References Cited

U.S. PATENT DOCUMENTS

| | | | |
|---|---|---|---|
| 2003/0059986 A1* | 3/2003 | Shibata | 438/149 |
| 2003/0235969 A1* | 12/2003 | Yokota | 438/396 |
| 2004/0033648 A1* | 2/2004 | Matsunaga et al. | 438/154 |
| 2004/0246765 A1* | 12/2004 | Kato | 365/149 |
| 2005/0070054 A1* | 3/2005 | Hotta | 438/151 |
| 2005/0266693 A1* | 12/2005 | Maekawa | 438/720 |
| 2006/0160281 A1* | 7/2006 | Huang | 438/149 |
| 2007/0165148 A1* | 7/2007 | Koyama | 349/38 |
| 2008/0121892 A1 | 5/2008 | Tseng | |
| 2008/0225190 A1* | 9/2008 | Chen et al. | 349/38 |
| 2012/0242624 A1* | 9/2012 | Tomiyasu et al. | 345/175 |
| 2012/0289006 A1* | 11/2012 | Yuan | 438/158 |
| 2013/0029446 A1* | 1/2013 | Kim et al. | 438/34 |

FOREIGN PATENT DOCUMENTS

| | | |
|---|---|---|
| TW | I356654 | 1/2012 |
| TW | I364614 | 5/2012 |

* cited by examiner

*Primary Examiner* — Minh-Loan Tran
*Assistant Examiner* — Fazli Erdem
(74) *Attorney, Agent, or Firm* — Winston Hsu; Scott Margo

(57) ABSTRACT

A method for fabricating a pixel structure includes the following steps. A patterned semiconductor layer, an insulation layer, and a patterned metal layer are formed on a substrate sequentially. A first inter-layer dielectric (ILD) layer is formed to cover the patterned metal layer. A low temperature annealing process is performed after forming the first ILD layer. A hydrogen plasma treatment process is performed after the low temperature annealing process. A second ILD layer is formed to cover the first ILD layer after the hydrogen plasma treatment process. A third ILD layer is formed to cover the second ILD layer. A source electrode and a drain electrode are formed on the third ILD layer. A passivation layer is formed on the source electrode and the drain electrode. A pixel electrode is formed on the passivation layer. A pixel structure manufactured by the above-mentioned method is also provided.

9 Claims, 7 Drawing Sheets

METHOD OF FABRICATING PIXEL STRUCTURE AND PIXEL STRUCTURE THEREOF

BACKGROUND OF THE INVENTION

1. Field of the Invention

The present invention relates to a pixel structure and a method of making the same, and more particularly, to a pixel structure and a method of making the same which use a low temperature annealing process to activate a semiconductor layer, and a hydrogen plasma treatment process to hydrogenate the semiconductor layer.

2. Description of the Prior Art

To meet the requirement for display panel e.g. high resolution, high aperture ratio, etc, low temperature polysilicon (LTPS) transistor with high electric mobility has been applied to display panel. Additionally, a flexible display panel has been developed in order to fulfill the requirements for compact size and portability of consumer electronic products. The glass substrate must be replaced with the flexible plastic substrate to reach the demand for the flexible display. However, the flexible plastic substrate is not resistant to high temperature so that the process temperature is limited, which will affect the element characteristic of the thin film transistor, such as electric mobility. At present, the problem of the flexible display development need to be solved is to enhance the element characteristic without deteriorating the flexible substrate.

SUMMARY OF THE INVENTION

It is therefore one of the objectives of the present invention to provide a pixel structure and a method of making the same to improve the mobility of the pixel structure.

In accordance with an embodiment of the present invention, a method of forming a pixel structure includes the following steps. A substrate is provided and a patterned semiconductor layer is formed on the substrate. An insulation layer is then formed on the substrate to cover the patterned semiconductor layer, and a patterned metal layer is formed on the insulation layer. The patterned semiconductor layer partially overlaps the patterned metal layer in a perpendicular projection direction. A first inter-layer dielectric (ILD) layer is formed on the patterned metal layer. A low temperature annealing process is performed after forming the first ILD layer. A hydrogen plasma treatment process is performed after the low temperature annealing process. A second ILD layer is formed on the first ILD layer after the hydrogen plasma treatment process. A third ILD is formed on the second ILD layer, and a first contact window and a second contact window are formed in the third ILD layer, the second ILD layer, the first ILD layer and the insulation layer to partially expose the patterned semiconductor layer. A source electrode and a drain electrode are formed on the third ILD layer. The source electrode is electrically connected to the patterned semiconductor layer via the first contact window, and the drain electrode is electrically connected to the patterned semiconductor layer via the second contact window. A passivation layer is formed on the source electrode and the drain electrode, and a third contact window is formed in the passivation layer to partially expose the drain electrode. A pixel electrode is formed on the passivation layer, and the pixel electrode is electrically connected to the drain electrode via the third contact window.

In accordance with another embodiment of the present invention, a pixel structure includes a substrate, a patterned semiconductor layer, an insulation layer, a gate electrode, a first inter-layer dielectric (ILD) layer, a second ILD layer, a third ILD layer, a source electrode, a drain electrode, a passivation layer and a pixel electrode. The patterned semiconductor layer is disposed on the substrate, and the patterned semiconductor layer includes a channel layer, a doping source, a doping drain, a light doping source and a light doping drain. The insulation layer is disposed on the patterned semiconductor layer. The gate electrode is disposed on the insulation layer, and the channel layer overlaps the gate electrode in a perpendicular projection direction. The first ILD layer is disposed on the gate electrode. The second ILD layer is disposed on the first ILD layer. The third ILD layer is disposed on the second ILD layer. The insulation layer, the first ILD layer, the second ILD layer, and the third ILD layer have a first contact window and a second contact window partially exposing the patterned semiconductor layer. The source electrode and the drain electrode are disposed on the third ILD layer. The source electrode is electrically connected to the patterned semiconductor layer via the first contact window, and the drain electrode is electrically connected to the patterned semiconductor layer via the second contact window. The thickness of the first ILD layer is substantially in a range between 20 nanometers (nm) and 40 nm, and the sum of the thickness of the first ILD layer and the thickness of the second ILD layer is substantially in a range between 200 nm and 400 nm. The passivation layer is disposed on the source electrode and the drain electrode, and the passivation layer has a third contact window partially exposing the drain electrode. The pixel electrode is disposed on the passivation layer, and the pixel electrode is electrically connected to the drain electrode via the third contact window.

The pixel structure of the present invention uses a low temperature annealing process to activate the semiconductor layer, and a hydrogen plasma treatment process to hydrogenate the semiconductor layer so that the defect of the semiconductor layer is fixed, and the hydrogenation of the semiconductor layer is further increased.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention, preferred embodiments will be made in detail. The preferred embodiments of the present invention are illustrated in the accompanying drawings with numbered elements.

Figure 1:
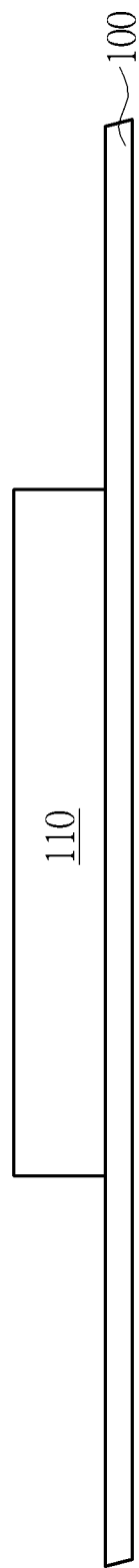
FIGS. 1-7 are cross-sectional diagrams illustrating a method of fabricating a pixel structure according to an embodiment of the present invention.

Please refer to FIGS. 1-7. FIGS. 1-7 are cross-sectional diagrams illustrating a method of forming a pixel structure according to an embodiment of the present invention. Referring to FIG. 1 to FIG. 7, the method of forming the pixel structure of the present embodiment includes the following steps. As shown in FIG. 1, a substrate 100 is provided. The substrate 100 may be, for example, a flexible substrate or a glass substrate. The flexible substrate may be a polyimide (PI) substrate or other flexible plastic substrate, but is not limited thereto. Then, a patterned semiconductor layer 110 is formed on the substrate 100. The material of the patterned semiconductor layer 110 may be amorphous silicon, but is not limited thereto. The patterned semiconductor layer 110 may be patterned by a photolithography and etching process (PEP), but is not limited thereto. In the present embodiment, the material of the patterned semiconductor layer 110 may be converted from amorphous silicon into polysilicon with an excimer laser annealing (ELA) process, but is not limited thereto.

Figure 2:
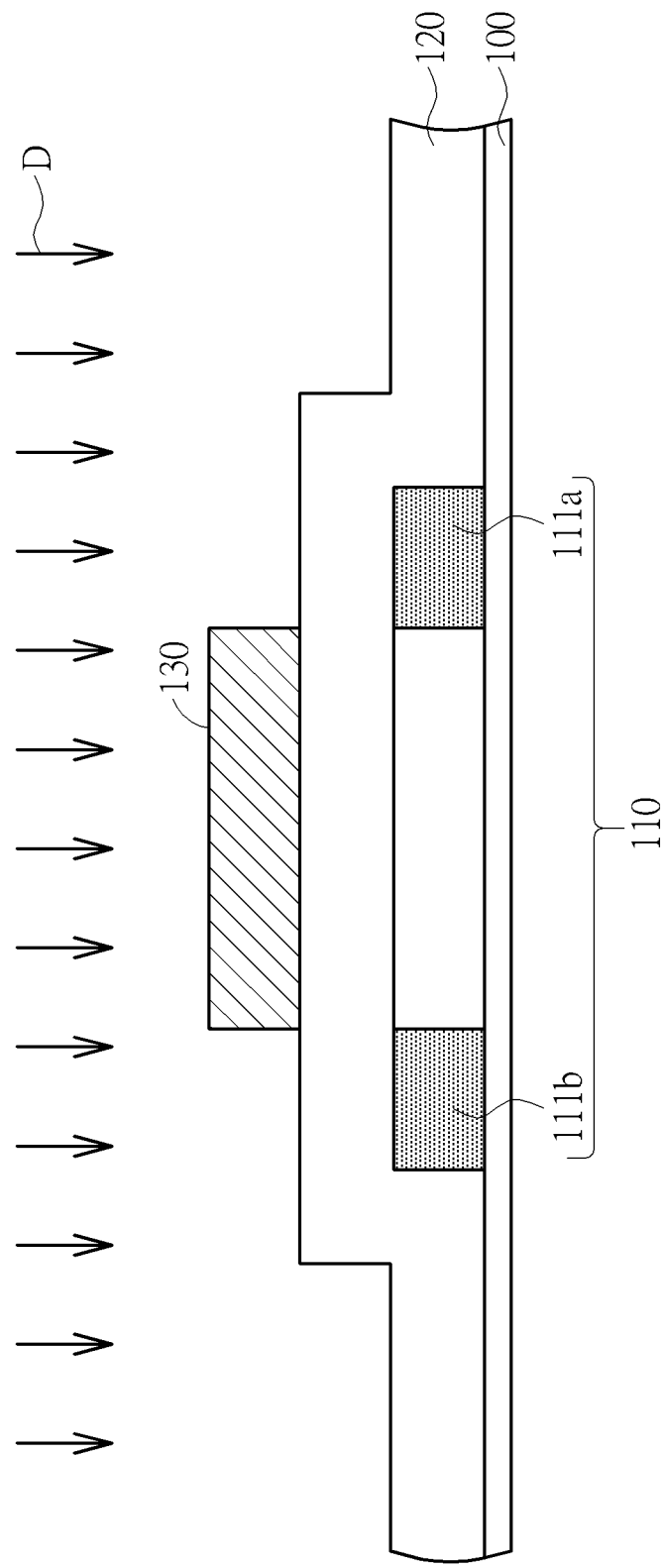

As shown in FIG. 2, an insulation layer 120 is formed on the patterned semiconductor layer 110 and the substrate 100. Then, a patterned metal layer 130 is formed on the insulation layer 120, and the patterned metal layer 130 may be formed by sputtering and etching methods, but is not limited thereto. The material of the patterned metal layer 130 may be metal or alloy, such as gold, silver, copper, aluminum, titanium, molybdenum or the combination thereof, but is not limited thereto. The patterned metal layer 130 partially overlaps the patterned semiconductor layer 110 in the perpendicular projection direction. In the present embodiment, a doping source 111a and a doping drain 111b are formed in the pattern semiconductor layer 110 by performing a doping process D using a photoresist pattern for defining the pattern metal layer 130 as a mask after forming the pattern metal layer 130. The doping process D may be a P-type doping process or an N-type doping process but is not limited thereto.

Figure 3:
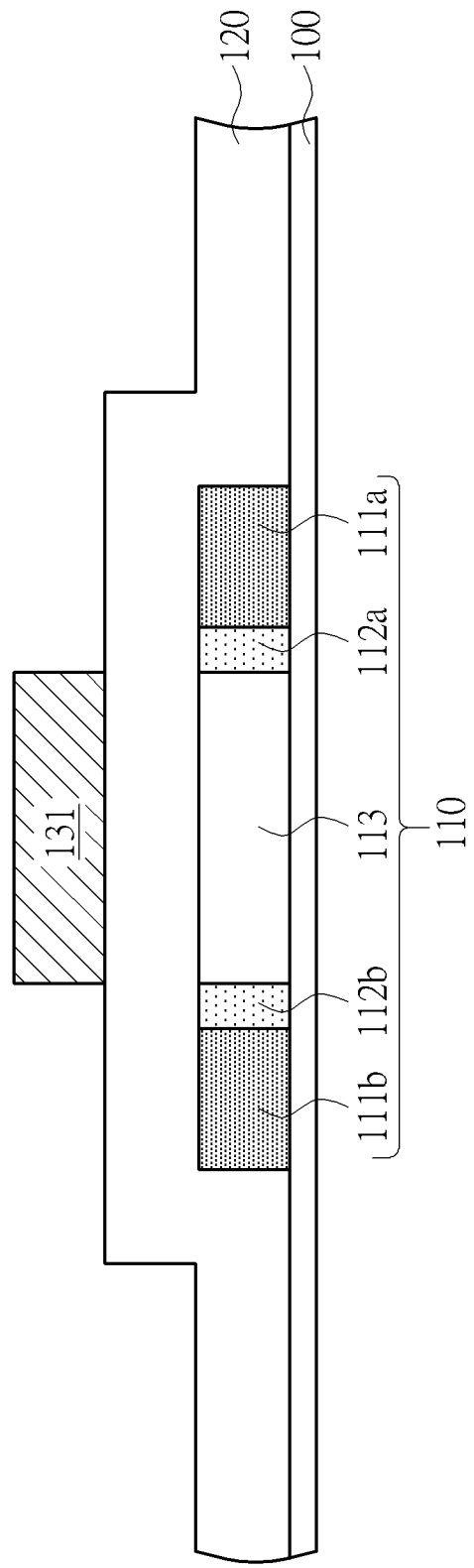

As shown in FIG. 3, an etching process, such as a wet-etching process, is performed to partially remove the side wall of the patterned metal layer 130 to form a gate electrode 131. The photoresist pattern is then removed to expose regions where a light doping source and a light doping drain are to be formed. Then, a light doping process using the gate electrode 131 as a mask is performed to form a light doping source 112a and a light doping drain 112b, but is not limited thereto. Besides, a channel layer 113 is formed of the non-doping part of the pattern semiconductor layer 110 that is overlapping the gate electrode 131 in the perpendicular direction. In this invention, the above mentioned methods of forming the gate electrode 131, the doping source 111a, the doping drain 111b, the light doping source 112a and the light doping drain 112b are not limited thereto. For example, in a variation embodiment, the metal layer is formed on the insulation layer 120, and a photoresist pattern is formed on the metal layer by a halftone mask, wherein the regions for forming the doping source 111a and the doping drain 111b are exposed by the photoresist pattern. The thickness of the photoresist pattern corresponding to the region for forming the gate electrode 131 is greater than the thickness of the photoresist pattern corresponding to the region for forming the light doping source 112a and the light doping drain 112b. The metal layer exposed by the photoresist pattern is then etched to form the pattern metal layer 130, and then the doping source 111a and the doping drain 111b are formed by the doping process D using the photoresist pattern as a mask. The photoresist pattern with thinner thickness is then removed by an ashing process to expose the regions for forming the light doping source 112a and the light doping drain 112b. Subsequently, the gate electrode 131 is formed by etching the pattern metal layer 130 exposed by the partially removed photoresist pattern. The light doping source 112a and the light doping drain 112b are formed by the light doping process using the photoresist pattern as a mask. Alternatively, in another variation embodiment, the doping source 111a and the doping drain 111b are formed by a doping process using a photomask (reticle) as a mask, and the light doping source 112a and the light doping drain 112b are then formed by a light doping process using the gate electrode 131 as a mask.

Figure 4:
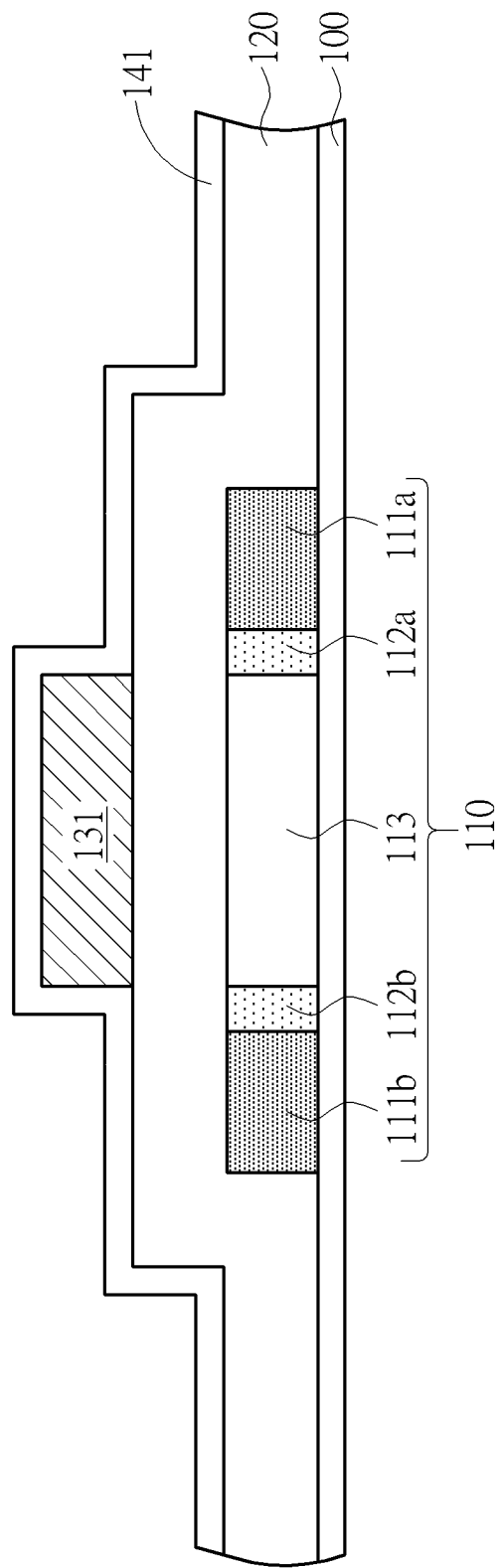

As shown in FIG. 4, a first inter-layer dielectric (ILD) layer 141 is formed to disposed on and cover the gate electrode 131 and the insulation layer 120. The material of the first ILD layer 141 may be, for example, silicon oxide (SiOx), and the thickness of the first ILD layer 141 is substantially in a range between 20 nm and 40 nm, but is not limited thereto. In this embodiment, the thickness of the first ILD layer 141 may be, for example 30 nm, but is not limited thereto. After forming the first ILD layer 141, a low temperature annealing process is performed. The temperature of the low temperature annealing process is substantially less than or equal to 400° C. In this embodiment, the low temperature annealing process is required to process substantially for 1-2 hours at 400° C. The doping source 111a, the doping drain 111b, the light doping source 112a and the light doping drain 112b are activated by the heat treatment of the low temperature annealing process. The activation means that an ion diffusion process is performed during heating the doping source 111a, the doping drain 111b, the light doping source 112a and the light doping drain 112b, and the electric characteristic of the thin film transistor is enhanced. Then, a hydrogen plasma treatment process is performed by introducing hydrogen gas when the temperature is maintained for example at approximately 400° C. In this embodiment, the channel layer 113 is hydrogenated by the hydrogen plasma treatment process, and the hydrogen plasma treatment process is required to process substantially for 2-3 minutes. The hydrogenation means that the broken bond between the silicon or the silicon and the interface of the channel layer 113 is repaired, and the device characteristic of the thin film transistor is enhanced since the material defect is repaired.

Figure 5:
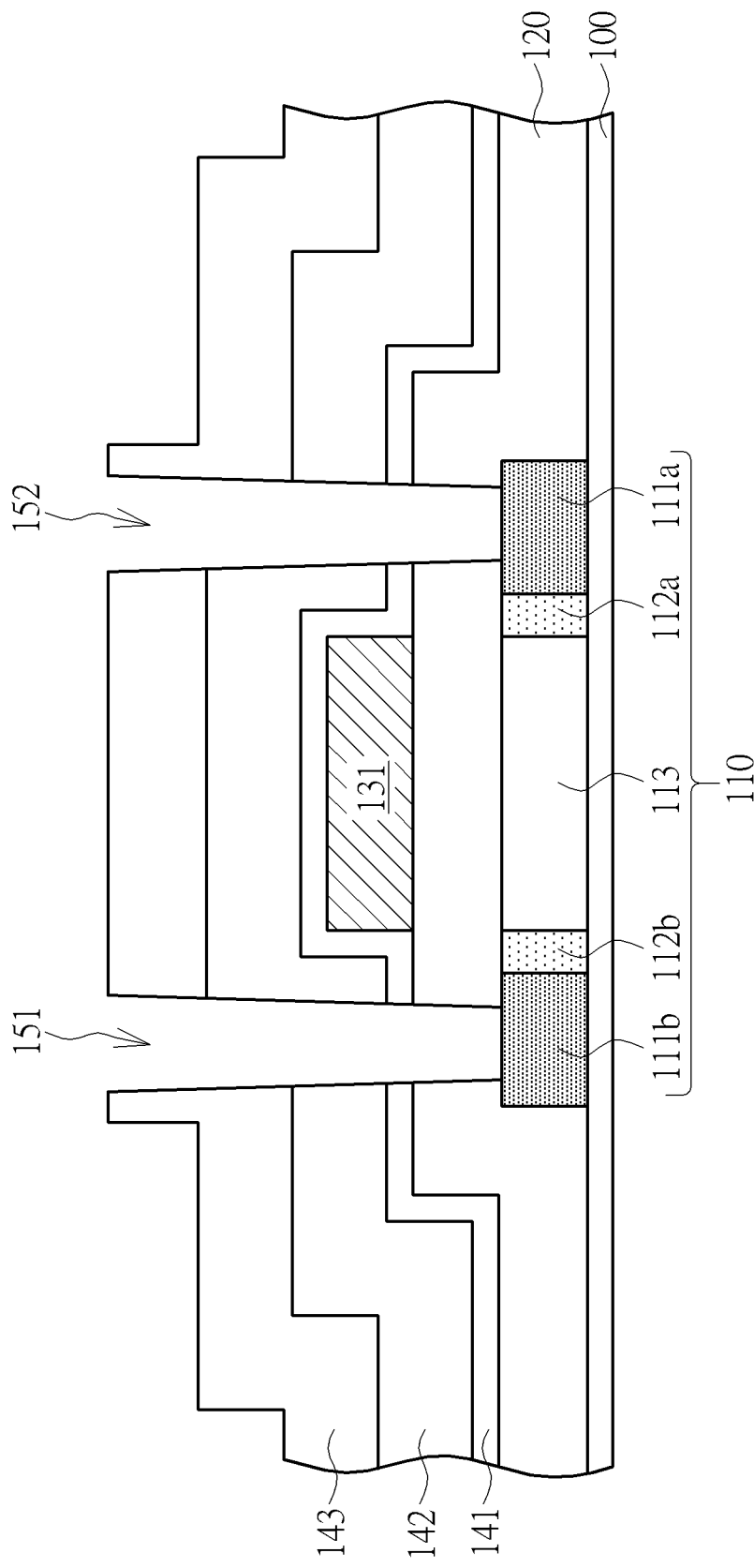

As shown in FIG. 5, a second ILD layer 142 is formed on the first ILD layer 141. The material of the second ILD layer 142 may be, for example, silicon oxide, but is not limited thereto. The sum of the thickness of the first ILD layer 141 and the thickness of the second ILD layer 142 is substantially in a range between 200 nm and 400 nm, but is not limited thereto. A third ILD layer 143 is formed on the second ILD layer 142. The material of the third ILD layer 143 may be, for example, silicon nitride (SiNx), but is not limited thereto. The thickness of the third ILD layer 143 is substantially in a range between 200 nm and 400 nm, but is not limited thereto. In the present embodiment, the sum of the thicknesses of the first ILD layer 141, the second ILD layer 142 and the third ILD layer 143 is about 600 nm, but is not limited thereto. A first contact window 151 and a second contact window 152 are formed in the third ILD layer 143, the second ILD layer 142, the first ILD layer 141 and the insulation layer 120. The doping drain 111b is exposed by the first contact window 151, and the doping source 111a is exposed by the second contact window 152. In this embodiment, the methods of forming the first contact window 151 and the second contact window 152 may be photolithography and etching processes, but is not limited thereto.

Figure 6:
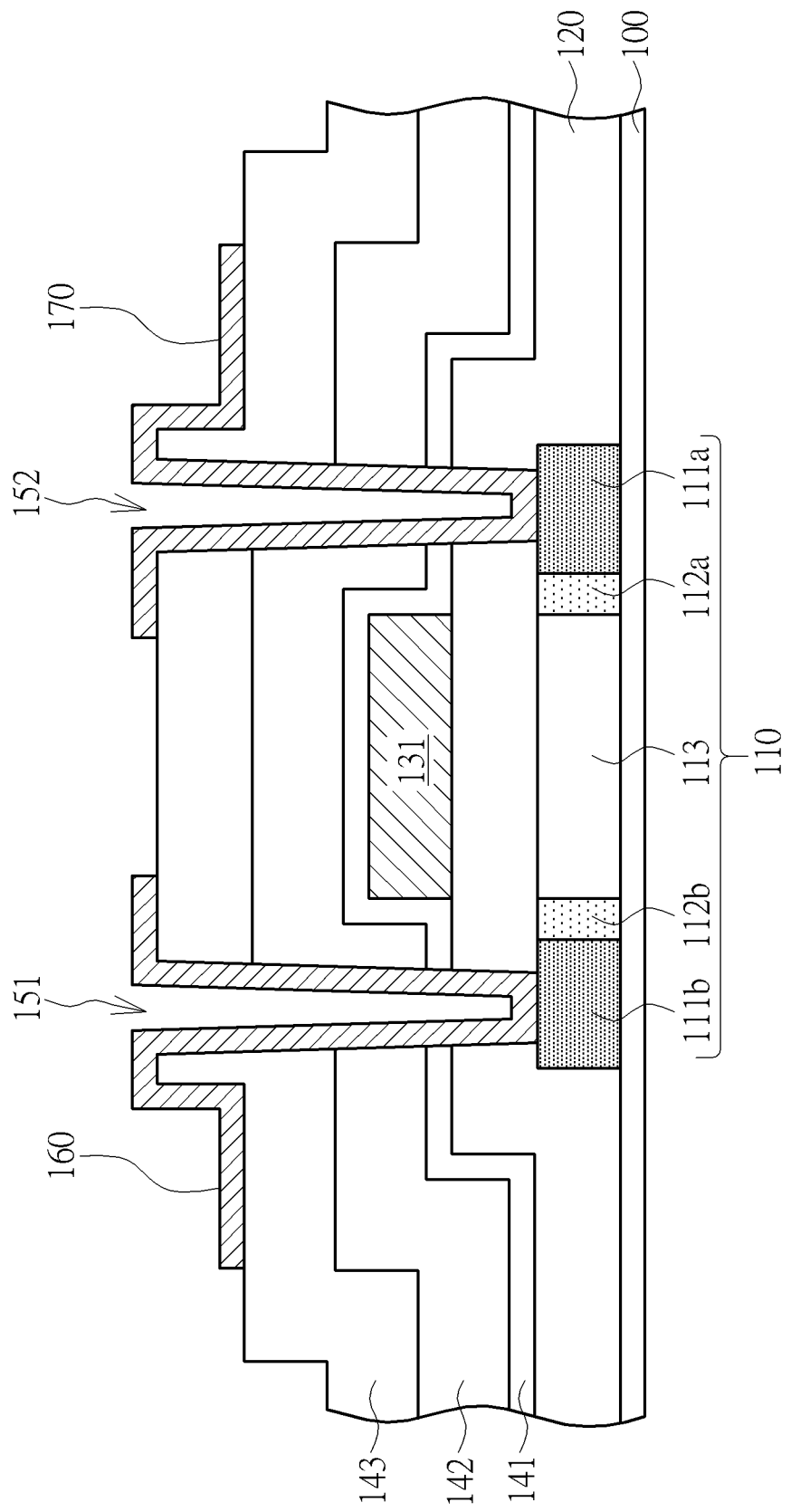

As shown in FIG. 6, a drain electrode 160 and a source electrode 170 are formed on the third ILD layer 143, wherein the drain electrode 160 is electrically connected to the doping drain 111b via the first contact window 151, and the source electrode 170 is electrically connected to the doping source 111a via the second contact window 152. In this embodiment, the methods of forming the drain electrode 160 and the source electrode 170 may be photolithography and etching processes, but is not limited thereto.

Figure 7:
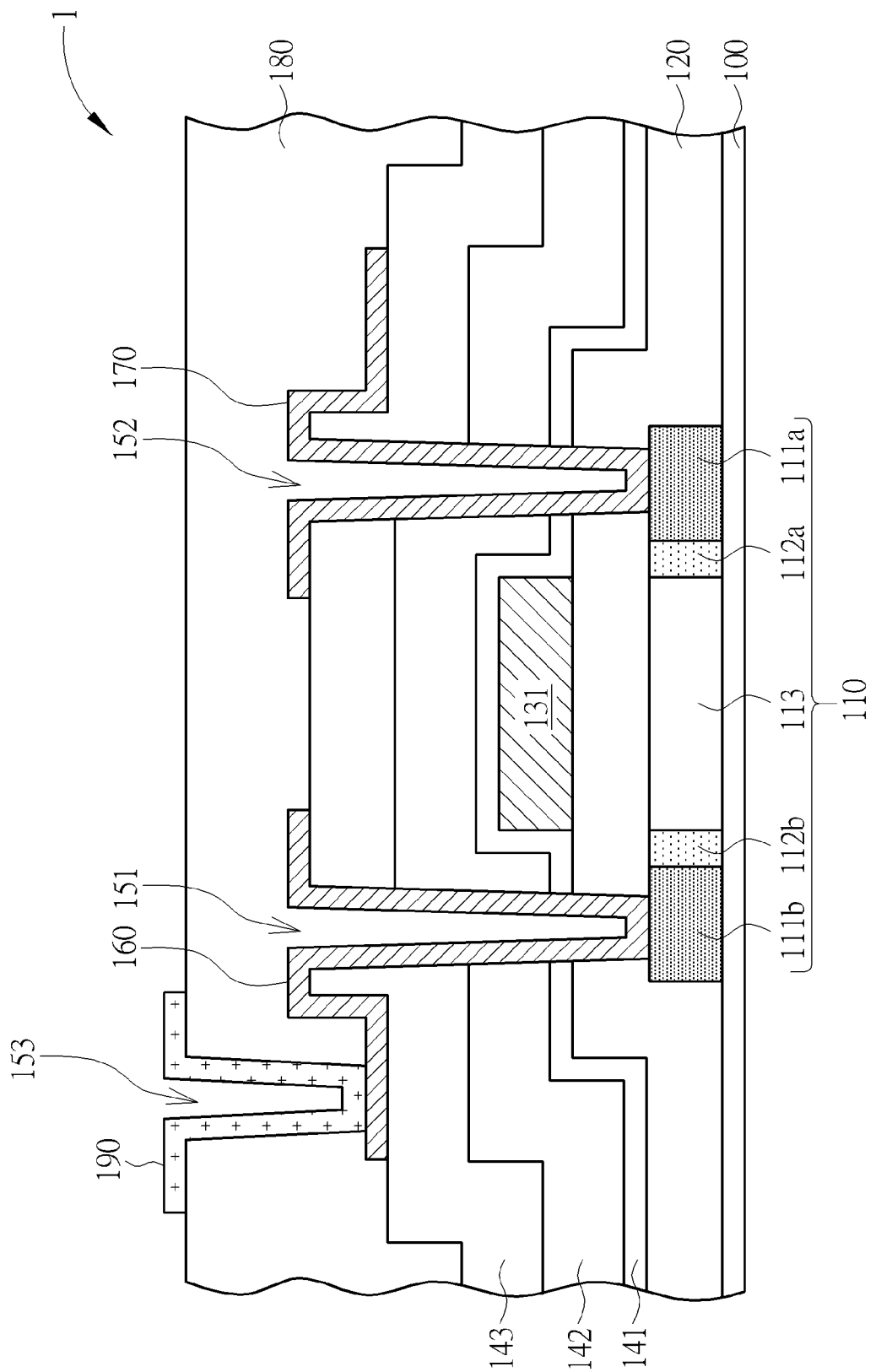

As shown in FIG. 7, a passivation layer 180 is formed on the drain electrode 160 and the source electrode 170, and a third contact window 153 is formed in the passivation layer 180 to partially expose the drain electrode 160. The passivation layer 180 may be single-layered or multi-layered. The material of the passivation layer 180 may be, for example, an inorganic material, an organic material and an organic/inorganic mixed material. Finally, a pixel electrode 190 is formed on the passivation layer 180, and the pixel electrode 190 is electrically connected to the drain electrode 160 via the third contact window 153. A pixel structure 1 of this embodiment is manufactured by the above-mentioned method. The material of the pixel electrode 190 may be a transparent conductive material, such as indium tin oxide (ITO) or indium zinc oxide (IZO) or other suitable material. In this embodiment, the above-mentioned pixel structure is preferably applied to a flexible organic light emitting diode display, and it can also be applied to a liquid crystal display, an organic light emitting diode display, a flexible display, other display, etc.

Refer to Table 1. Table 1 illustrates the test results of the threshold voltage ($V_{the}$), the electric mobility, the subthreshold swing (S.S.), the on current ratio ($I_{on}$) and the off current ratio ($I_{off}$) of the present embodiment and a comparison example.

TABLE 1

|  | The comparison example | The present embodiment |
|---|---|---|
| $V_{the}$ (V) | −2.1 | −2.6 |
| Mobility (cm$^2$/VS) | 47 | 63 |
| S.S. (V/sec) | 0.26 | 0.15 |
| $I_{on}$ (µA) (VG = −10 V) | 80 | 60 |
| $I_{off}$ (pA) (VG = 3~8 V) | 0.9 | 4.6 |

Different from the present embodiment, the method of forming the comparison example includes the following steps. A first ILD layer (SiOx) of 300 nm and a second ILD layer (SiNx) of 300 nm are deposited on the gate electrode subsequent to forming a pattern semiconductor layer and a gate electrode sequentially. Then, a low temperature annealing process is performed after forming the first ILD layer and the second ILD layer. Therefore, the hydrogen atoms contained in the second ILD layer are diffusing into the gate electrode and the pattern semiconductor layer by annealing. Since the diffusion efficiency is low at low temperature, the efficiency of hydrogenation is low accordingly. As shown in Table 1, the electric mobility of the thin film transistor of the comparison example is about 47 cm$^2$/VS, and the S.S. is about 0.26 V/sec. The mobility of the thin film transistor of the present embodiment is about 63 cm$^2$/VS, and the S.S. is about 0.15 V/sec. It should be noted that the electric characteristic of the thin film transistor is superior when the electric mobility is higher and the S.S. is lower. Hence, in comparison with the electric mobility and the S.S. of the comparison example, the electric mobility and the S.S. of the present invention are better. Consequently, the electric characteristic of the thin film transistor of the present invention is better. As evidenced in Table 1, the method of manufacturing the pixel structure of the present invention makes the thin film transistor have the better electric characteristic, the higher mobility and the better S.S.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a pixel structure, comprising:
   providing a substrate;
   forming a patterned semiconductor layer on the substrate;
   forming an insulation layer on the patterned semiconductor layer;
   forming a patterned metal layer on the insulation layer, wherein the patterned metal layer partially overlap the patterned semiconductor layer in a perpendicular projection direction;
   forming a first inter-layer dielectric (ILD) layer covering the patterned metal layer after forming the patterned metal layer;
   performing a low temperature annealing process after forming the first ILD layer;
   performing a hydrogen plasma treatment process after the low temperature annealing process;
   forming a second ILD layer covering the first ILD layer after the hydrogen plasma treatment process;
   forming a third ILD layer covering the second ILD layer;
   forming a first contact window and a second contact window in the third ILD layer, the second ILD layer, the first ILD layer and the insulation layer to partially expose the patterned semiconductor layer, respectively;
   forming a source electrode and a drain electrode on the third ILD layer, wherein the source electrode is electrically connected to the patterned semiconductor layer via the first contact window, and the drain electrode is electrically connected to the patterned semiconductor layer via the second contact window;
   forming a passivation layer on the source electrode and the drain electrode, and forming a third contact window in the passivation layer to partially expose the drain electrode; and
   forming a pixel electrode on the passivation layer, the pixel electrode being electrically connected to the drain electrode via the third contact window.

2. The method of forming the pixel structure according to claim 1, wherein a thickness of the first ILD layer is substantially in a range between 20 nanometers (nm) and 40 nm.

3. The method of forming the pixel structure according to claim 1, wherein a sum of the thickness of the first ILD layer and a thickness of the second ILD layer is substantially in a range between 200 nm and 400 nm.

4. The method of forming the pixel structure according to claim 1, wherein a thickness of the third ILD layer is substantially in a range between 200 nm and 400 nm.

5. The method of forming the pixel structure according to claim 1, wherein the first ILD layer and the second ILD layer comprise silicon oxide (SiOx).

6. The method of forming the pixel structure according to claim 1, wherein the third ILD layer comprises silicon nitride (SiNx).

7. The method of forming the pixel structure according to claim 1, wherein a temperature of the low temperature annealing process is substantially equal to or lower than 400° C. .

8. The method of forming the pixel structure according to claim 1, further comprising performing a doping process to form a doping source and a doping drain in the patterned semiconductor layer that are uncovered by the patterned metal layer in the perpendicular projection direction.

9. The method of forming the pixel structure according to claim 8, further comprising:
   removing a part of the patterned metal layer to form a gate electrode; and
   forming a light doping source between the doping source and the channel layer and forming a light doping drain between the doping drain and the channel layer, thereby a channel layer is formed in a portion of the patterned semiconductor layer overlapping the gate electrode in the perpendicular projection direction.

\* \* \* \* \*